United States Patent [19]

Kwok et al.

[11] 4,245,230
[45] Jan. 13, 1981

[54] RESISTIVE SCHOTTKY BARRIER GATE MICROWAVE SWITCH

[75] Inventors: Siang-Ping Kwok; Glenn O. Ladd, Jr., both of Rancho Palos Verdes, Calif.

[73] Assignee: Hughes Aircraft Company, Culver City, Calif.

[21] Appl. No.: 79,854

[22] Filed: Sep. 28, 1979

[51] Int. Cl.³ .................... H01L 29/64; H01L 29/80
[52] U.S. Cl. ........................................ 357/15; 357/22
[58] Field of Search .................................. 357/15, 22

[56] References Cited

U.S. PATENT DOCUMENTS 3,700,976 10/1972 Dill .......................................... 357/23
3,898,353 8/1975 Napoli et al. ........................... 357/22

Primary Examiner—Gene M. Munson
Attorney, Agent, or Firm—Elliot N. Kramsky; W. H. MacAllister

[57] ABSTRACT

A Schottky barrier resistive gate switch which may be utilized for microwave switching. First and second metallizations which serve as signal inputs overlie a semiconductive substrate, making contact with a doped region thereof. A gate of high resistivity material which forms a Schottky barrier with the substrate is positioned between the metallizations. The doped region defines a channel, the conductivity of which is adjusted by the regulation of the Schottky depletion region formed therein.

6 Claims, 7 Drawing Figures

RESISTIVE SCHOTTKY BARRIER GATE MICROWAVE SWITCH

TECHNICAL FIELD

The present invention relates to means for switching signals in the microwave frequency range and, in particular, to such means which employ solid state or semiconductor materials technology.

BACKGROUND ART

In the microwave switching art, switches incorporating the general principles of the FET (field effect transistor) figure prominently. Such devices generally feature laterally spaced source and drain electrodes connected to respective source and drain regions in a semiconductor substrate. The source and drain regions are laterally separated by a channel region therebetween. In the case of the common IGFET (insulated gate FET) the substrate is covered with at least one layer of insulating material, typically a semiconductor oxide, and a gate or control electrode is positioned thereon overlying at least a limited area of the channel region. A bias voltage applied in some manner to the gate electrode controls the conductivity of the channel, thereby effecting at least two states of conduction ("on" and "off").

The device described generally above has been adapted to the switching of signals in many frequency ranges, including microwave. This range of frequencies varies from one to approximately three hundred gigahertz, including a number of significant frequency bands.

Devices incorporating the general FET principle of operation (i.e. varying the conductivity of a predetermined circuit path) have been adapted to the microwave range, as noted above. One method of so doing has involved the provision of alternative conductive paths. One path may be biased to two different conductivity states while the other path is of high resistivity (non-insulative). The two paths, in shunt relationship, pass essentially all of the microwave signal through the substrate when the variable conductivity path is biased to its high conductivity state and little, if any, of the signal when the path is biased to low conductivity, as the highly resistive element remains a near open circuit to the microwave signal. Provision of a high resistivity "off" state path results in a device having a large power handling capacity. An example of such a microwave switch is disclosed in U.S. Pat. No. 3,700,976, issued to Dill for "Insulated Gate Field Effect Transistor Adapted for Microwave Applications". This Patent, the property of the assignee herein, discloses a silicon switch having two shunted circuit paths through two separate layers of semiconductive material separated by an electrically insulative layer therebetween. A highly resistive polysilicon layer is formed atop the insulating layer while a channel of variable conductivity between laterally spaced, source and drain regions formed in the silicon substrate is normally non-conductive and, due to the high resistivity of the polysilicon layer the unbiased device is essentially an open circuit ("off" state). An "on" state is achieved by the application of a proper bias to the highly doped regions resulting in the injection of electrons into the channel and consequent increased channel conductivity.

The Dill device, although desirable, is not well suited to low noise operation at higher frequencies. The device is frequency limited by its necessary fabrication upon a silicon substrate. Such a materials choice is occasioned by the use of an insulating oxide layer to separate the conductive channel from the highly resistive gate.

A much more desirable materials technology for microwave frequencies is gallium arsenide (GaAs). The high carrier mobility of this material (relative to silicon, among others) forms the basis for this preference. Unlike geometries amenable to silicon devices, however, the fabrication and design of GaAs devices is complicated by the difficulty encountered in the fabrication of a reliable insulator on a GaAs substrate. In the standard metal semiconductor FET (MESFET), source and drain electrodes are positioned on either side of a metal gate. The three metallizations lie directly atop a doped gallium arsenide substrate, the drain and source electrodes forming ohmic contacts with the GaAs while the gate forms a Schottky barrier. As the formation of a high quality insulative oxide layer on gallium arsenide is not feasible at the present time, the Schottky barrier is used to control channel conductivity. With no bias voltage, the highly doped channel region provides a high conductivity path between the drain and source electrodes, thus providing a low noise path for the high frequency signal in the high carrier mobility GaAs channel. To achieve an "off" state, the gate, which forms a Schottky barrier with the channel, is so biased as to deplete the channel of all carriers. (The drain and source, neither of which forms a Schotty barrier with the substrate, act as electron "sinks"). The MESFET lacks the power handling capability of the insulated gate technology described above as the above-described presence of a gate metallization has a tendency to reduce both the drain-to-source and the gate-to-source breakdown voltages. Additionally, the basic MESFET geometry places an effective lower limit, both physical and in the terms of economy of manufacture, upon the channel length of such a device. The metallic source, gate and drain thereof present a potential short if not carefully aligned when, as in the basic structure, all three electrodes, or ohmic contacts, lie atop the GaAs substrate. It can be shown that the channel's resistance is proportional to its length and, therefore, the minimization thereof is highly desirable in terms of minimizing the insertion loss, power consumption and other circuit parameters effected thereby.

A commonly attempted solution to the problems associated with the planar MESFET has been the processing of the GaAs substrate to form an intrinsic channel so that the metallic gate lies below the level of the source and drain. In this way, the length of the gate is effectively the length of the channel as the source-to gate and drain to-gate spacings lie in a plane perpendicular to the plane of the channel.

This approach has been employed and illustrated in a number of patents including U.S. Pat. No. 3,898,353 issued to Napoli et al, for "Self Aligned Drain and Gate Field Effect Transistor" and French Brevet D'invention No. 70.29258 of Thomson-CSF for "Improvement to Field-Effect Transistor" ("Aux Transistors a'Effect de Champ"). The devices disclosed in these patents and others which feature the recess of the metallic gate within the doped GaAs substrate are hampered in operation by parasitic capacitances resulting from this design approach, including a source-to-drain parallel plate capacitance, which may substantially degrade the switching function at high frequencies.

SUMMARY OF THE INVENTION

It is therefore an object of the present invention to improve the microwave switching art by providing a new gallium arsenide FET having low insertion loss occasioned in part by the provision of a narrower channel length than has been previously achieved in the art.

It is another object of the invention to achieve the above object without the generation of unwanted parasitic capacitances.

It is yet another object of the present invention to achieve the above object by means of a relatively easy-to-manufacture device geometry.

It is a further object of the present invention to achieve a gallium arsenide FET having improved voltage breakdown characteristics.

It is still another object of the present invention to produce a low noise microwave FET switch having improved power handling capability.

These and other objects are achieved by the present invention which prevents a microwave switch including a semiconductive substrate having oppositely disposed first and second surfaces. There is formed upon the first surface of the substrate a pair of metallizations, one metallization forming the drain and the other metallization forming the source of the FET. A gate of high resistivity is formed on the first surface of the substrate between the metallizations. The gate material and the first and second metallizations are so chosen as to form Schottky barriers with the underlying semiconductive substrate. Means are provided for applying a biasing voltage to the substrate to control the conductivity thereof. The substrate channel is preferably doped gallium arsenide, presenting a desirable high conductivity path for the microwave signal. When biased for conduction, the depletion regions underlying the source-gate-drain combination present a relatively low impedance path to the microwave signal comprising the bulk resistance of the channel in series with large capacitances formed by the Schottky depletion regions which interlie the conductive substrate and the metallizations. The relatively large capacitances filter undesired d.c. and low frequency noise from the microwave signal.

Other and further aspects of the present invention will become apparent during the course of the following description and by reference to the accompanying drawings.

BRIEF DESCRIPTION OF THE DRAWINGS

Referring now to the drawings in which like numerals represent like parts throughout.

DETAILED DESCRIPTION OF THE INVENTION

Figure 1:
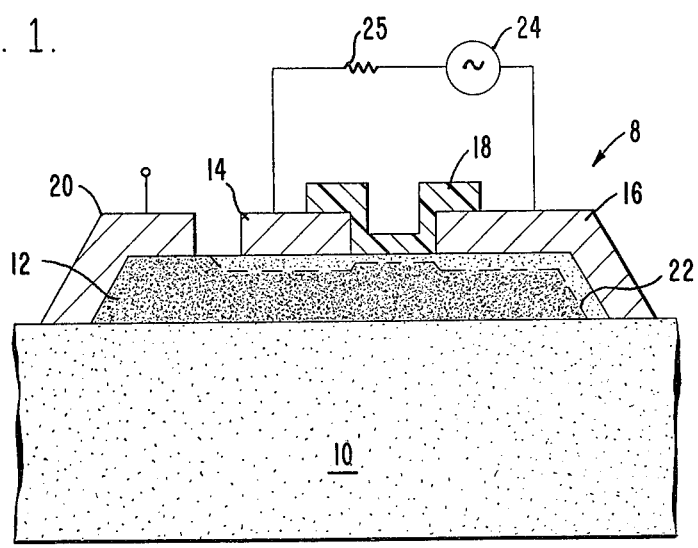
FIG. 1 presents a cross sectional view of mesa-type microwave switch according to the present invention.
Figure 4:
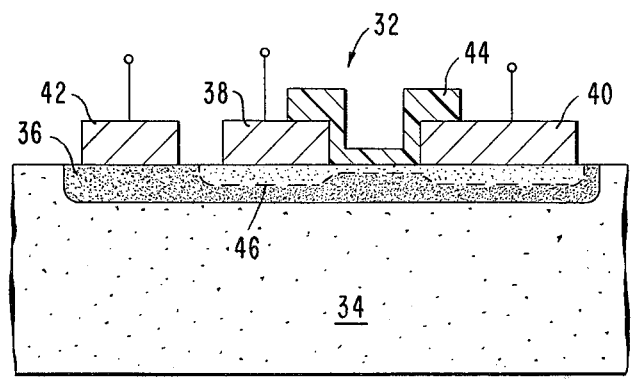
FIG. 4 is a side sectional view of a planar device which embodies the present invention.

Turning now to the drawings, a resistive gate microwave switch according to the present invention is shown in FIG. 1. The switch 8 shown in FIG. 1 includes a "mesa" configuration in accordance with which a version of this invention has been fabricated and tested to determine its relevant parameters. An alternative version which employs the inventive concept herein is shown in FIG. 4 ("planar" microwave device).

Returning to the switch 8 of FIG. 1, it can be seen that the device is formed upon a substrate 10 of semi-insulating gallium arsenide. The substrate 10 is essentially limited in function to mechanical support, giving substance to the otherwise-fragile device, and is necessarily fabricated to single crystal gallium arsenide having a resistivity typically on the order of $10^7$–$10^8$ ohm-centimeters. This resistivity may be achieved by introducing chromium or oxygen into a GaAs melt from which the substrate is then grown. (Typically, a thickness of ten mils is appropriate). Such substrates have been commercially available for many years from, among others, the Sumitomo Corporation of Japan and the Electronic Materials Corporation of Pasadena, Calif. An n-type layer of gallium arsenide 12 overlies the semi-insulating substrate 10. The layer 12 may be created by either an epitaxial deposition or an ion implantation. Known epitaxial processes of either the vapor phase epitaxial (VPE) or liquid phase epitaxial (LPE) variety may be employed. One such LPE process is described in U.S. Pat. No. 3,994,755 issued to G. S. Kamath et al and assigned to the assignee herein. An appropriate ion implantation may involve the implantation of silicon Si+ions into the semi-insulating substrate 10. Such implantation scheme may involve the transfer of the substrate 10, following conventional chemical polishing techniques to provide a smooth damage-free upper surface, to a suitable ion implantation chamber wherein the silicon ions are accelerated into the substrate under the influence of accelerating potentials. In the reduction to practice of the device of FIG. 1, the layer 12 was created on a three hundred and fifty micrometer thick chromium-doped semi-insulating substrate by the application of a dosage of $5.7 \times 10^{12}$ ions per square centimeter at 120 kev followed by the subsequent implantation dosage of $1.3 \times 10^{12}$ ions per square centimeter at 20 kev. The above-mentioned mesa geometry of the layer 12 was then defined by well known and documented photoresist and etching techniques after the chemical vapor deposition of a 2000 Angstroms thick passivating film of $SiO_2$ followed by the annealing of the substrate (to activate the ions to conduction) at 830° centigrade for twenty minutes.

A source electrode 14 and a drain electrode 16 overlie the doped layer 12. The source electrode 14 and the drain electrode 16 are selected of (metallic) material that forms a Schottky barrier with the underlying doped layer 12 of GaAs. The ready formation of a Schottky barrier with GaAs is inherent in a number of metals including, but not limited to, aluminum, chrome-palladium-gold and titanium-platinum-gold. A number of processes including sputter deposition, evaporation and photoresist liftoff, all well-known in the art, may be utilized to form the Schottky barrier electrodes 14, 16. An ohmic contact substrate electrode 20 may be provided by the evaporation of gold-germanium alloy, nickel and gold and their subsequent alloy at 480° centigrade in forming gas for about thirty seconds. As will be seen from the discussion following, as a primary purpose the substrate electrode 20 serves as an electron "sink" for the substrate.

Interlying the source electrode 14 and the drain electrode 16 is a gate 18 of very high resistivity. The gate 18, which may conveniently be sputter deposited over the electrodes 14, 16 is selected of material chosen according to two criteria. The material must (1) present effectively an open circuit impedance to microwave signal, and (2) form a Schottky barrier with the underlying gallium arsenide layer 12. The inventors herein have found that titanium dioxide ($TiO_2$) is one appropriate material satisfying both criteria. (A dashed line 22 indicates the various Schottky depletion regions underlying the interfaces of the source 14, the resistive gate 18 and the drain 16 with the doped GaAs layer 12. These regions and their significance will be discussed more fully with respect to the operation of the device, infra.) A substrate electrode 20, of metallization which does not form a Schottky barrier with the GaAs layer 12 (such as gold-gallium alloy) forms an ohmic contact with the substrate.

Figure 2A:
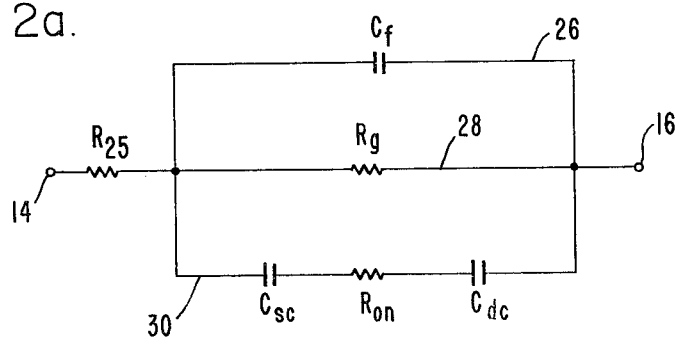
FIGS. 2a and 2b present electrical schematic views of, respectively, the "on" state and the "off" state of a switch according to the present invention.
Figure 2B:
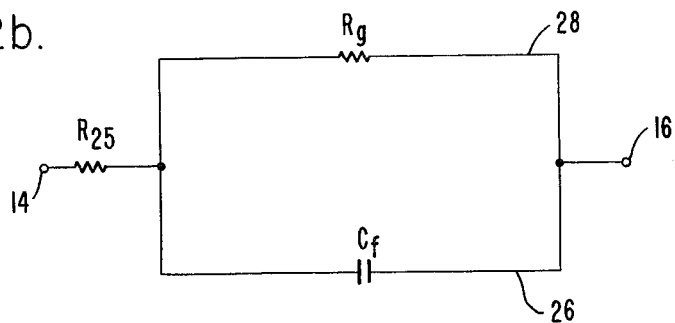

Referring now to FIGS. 2a and 2b, the operation of a microwave switch according to the present invention will be described. The "on" state of the switch 8 coincides with the electrical schematic view of FIG. 2a. This state is associated with the application of zero or a positive d.c. bias across the substrate electrode 20 and the source electrode 14. That is, the source electrode 14 is maintained at a zero bias voltage or a more positive potential than the substrate electrode 20. (As is apparent from the process by which other elements above the doped layer 12 have been formed, the electrodes 14, 16 and the resistive gate 18 are in intimate contact so that the d.c. potential of the source electrode 16 is common to all three elements.) In this bias state, a source of microwave signal 24, connected in series with a load 25 across the source electrode 14 and the drain electrode 16, "sees" the circuit of FIG. 2a. The current path 26 represents the relatively small (on the order of 0.1 pf) fringing capacitance $C_f$ across the closely spaced metallic electrodes 14, 16. Also shunted across the source and the drain is the current path 28 which includes the resistance $R_g$ of the resistive gate 18. The gate 18, as mentioned above, is chosen partially for its high resistivity and, thus, the path 28 behaves as a low loss open circuit. A third parallel circuit path 30, once again shunted across the source 14 and the drain 16, includes the relatively large (20–40 pf) capacitances $C_{sc}$ and $C_{dc}$ formed at the source electrode-substrate and drain electrode-substrate interfaces by the insulative Schottky depletion regions thereunder. These capacitances serve to isolate the source and drain electrodes 14, 16 at frequencies below the desired frequency of operation, thus minimizing the switch's holding current. In series with these capacitances is the relatively small (about one ohm) bulk channel resistance, $R_{on}$. It can be seen that the path 30 presents a low impedance circuit path for the microwave signal and, thus, the majority of current flow is through the channel in the doped layer 12. The resistance $R_{on}$ may be calculated as follows:

$$R_{on} = \frac{\rho}{t} \frac{L_c}{W_c},$$

where $\rho$ = resistivity of the channel region (region of substrate between source and drain electrodes)
t = thickness of conductive channel region
$L_c$ = channel length (distance between source and drain electrodes 14, 16)
$W_c$ = channel width From the above, it can be seen that the insertion power loss of the "on" state of the switch 8, a function of $R_{on}$, is decreased as the channel length is lessened. The resistive gate structure utilized allows this distance to be minimized beyond that which has heretofore possible in gallium arsenide MESFET technology. Unlike the standard GaAs microwave MESFET, the switch 8 does not possess a localized or differentiated metal gate electrode structure interlying the metallic source and drain electrodes 14, 16. Thus, the critical alignment problems generally encountered in attempting to miniaturize the MESFET are solved by the switch 8, a non-analogous (to MESFET) adaptation of gallium arsenide technology. While the lessening of the channel length (close spacing of drain and source) provides a highly desirable reduction in "on" state power consumption, the proximity of source-to-drain has significantly less effect upon the fringing capacitance, $C_f$, therebetween. Thus, it will be seen with respect to "off" state operation, that insertion power loss is also minimal in the "off" state as little energy leakage is encountered.

The "off" state operation of the switch 8 is shown schematically in FIG. 2b. This schematic differs from FIG. 2a by the absence of the parallel circuit branch 30 and, therefore, microwave signal energy may propagate only through the high resistance $R_g$ of the branch 26 or by means of the relatively low interelectrode fringing capacitance $C_f$ of the branch 28. The absence of signal propagation through the branch 30 is occasioned by the absence (through depletion) of charge carriers (mobile or "free" electrons) from the doped layer 12, producing a non-conductive open circuit. Depletion of the layer 12 results from the application of a negative d.c. bias across the source electrode 14-to-substrate electrode 20 terminals (i.e., source electrode 14 at lesser positive potential than the substrate electrode 20). In terms of the Schottky barrier 22 which underlies the source-resistive gate-drain combination, the "off" state represents the application of an electric field of adequate intensity and proper direction to increase the Schottky barrier depth, to the entire thickness of the doped layer 12 (which otherwise serves as a conductive channel). A relatively low value of $C_f$ coupled with a relatively high value of $R_g$, assures that essentially no microwave signal will be passed by the switch 8 when biased to the "off" state.

Resistive gate switches according to the above-disclosed mesa geometry, having interdigitated source and drain electrodes of aluminum and produced in accordance with the generally disclosed method described above, have been fabricated when channel dimensions of 1200 μm and 2400μ (channel width, $W_c$) by 1 μm (channel length, $L_c$). It was found that the reduction of channel length from 3 μm (the practical limit upon MESFET channel length) to 1 μm effect d a reduction of channel "on" resistance by a factor of 2.6.

Figure 3A:
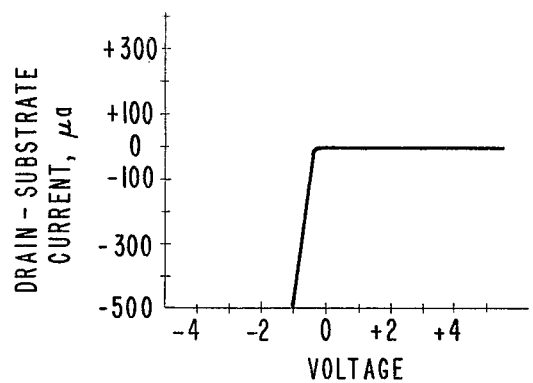
FIGS. 3a, 3b and 3c are graphs of the current voltage characteristics of the source electrode-substrate, drain electrode-substrate and source electrode-drain electrode terminals of a resistive gate switch fabricated according to the present invention.
Figure 3B:
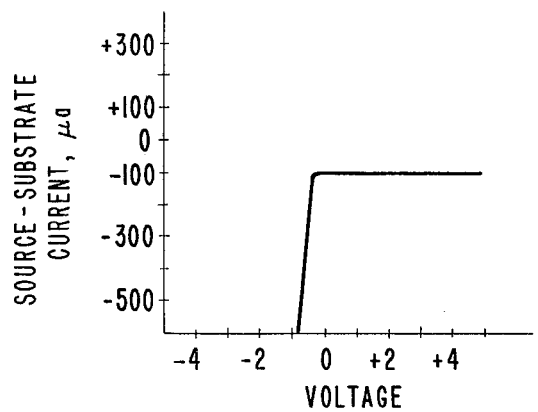
Figure 3C:
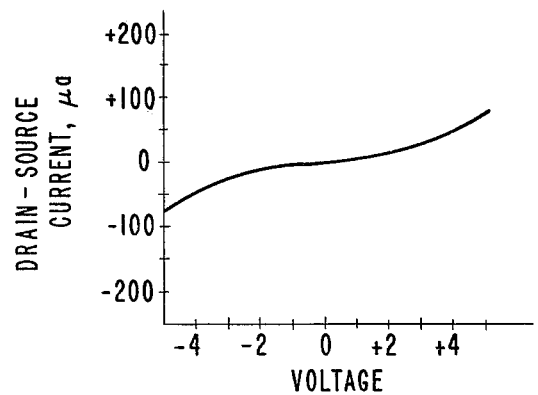

The drain-to-substrate, source-to-substrate and drain-to-source current voltage relationships of the 2400×1 μm switch are shown in FIGS. 3a, b and c respectively. Predictably, a Schottky barrier rectification is exhibited at the drain and source-to-substrate terminals while the drain-to-source current flow is characterized by a high resistance, $R_g$. Full depletion of the conductive channel of this device was attained at approximately 5 volts. Analysis at X-band disclosed ON/OFF isolation of 17.5 db with an insertion loss of only 2.5 db at 12.1 GHz.

Equivalent circuit elements according to the analysis supra were measured as follows:

| | |
|---|---|
| $C_{sc}$ = 40 pf | $R_{on}$ = 5 ohms |
| $C_{dc}$ = 27 pf | $R_g$ = 550 ohms |
| $C_f$ = 0.39 pf | $R_{25}$ = 0.5 ohms |

Thus, it can be seen that the theoretical operation of the resistive gate switch, is, in fact, achieved by the present invention. A GaAs device according to the present invention, featuring the extremely small channel length permitted by the unique Schottky barrier resistive gate, features large ON/OFF isolation with minimal power consumption. Large source and drain-to-substrate capacitances assure minimal device holding current. Additionally, the self-aligned process of manufacture disclosed allows the economical manufacture of such a switch.

Although the device is disclosed in one preferred embodiment above, various configurations are contemplated within the scope of the present invention.

In FIG. 4 there is shown a planar version of the switch 8 of FIG. 1. The planar switch 32 is fabricated and operates substantially as the mesa switch of FIG. 1. As above, this device is formed upon a substrate 34 of semi-insulating GaAs. The conductive Schottky channel 36 is preferably formed at the surface of the substrate 34 by well-known ion implantation steps as described supra. Once again, the channel 36 may be fabricated n-type by the implantation of Si+ions at an appropriate dosage and acceleration. Metallic source 38 and drain 40 electrodes form Schottky contacts with the channel 36 while a metallic substrate electrode 42 is in ohmic contact therewith, as described above. A resistive gate 44, once again selected of a non-metallic material, such as TiO₂, which forms a Schottky barrier with GaAs, interlies the source 38 and the drain 40.

In operation, a source of microwave signal is connected across the source 38 and the drain 40 in the manner of FIG. 1 to yield the identical switching functions shown schematically in FIGS. 2a and 2b. As in the switch 8 of FIG. 1, the substrate electrode 42 serves as a sink of electrons so that the channel 36 may be fully depleted for "off" state operation. The Schottky depletion region ("on" state) is shown by means of the dashed outline 46, thereby forming the capacitances $C_{sc}$ and $C_{dc}$ of FIG. 2a. The planar device provides an attractive alternative to the mesa-type device of FIG. 1. The critical channel length of the switch 32 is foreshortened as in the device of FIG. 1. The planar geometry, wherein all elements are situated upon a continuous substrate surface is advantageous in the large scale processing of durable switches according to the present invention and in the fabrication of large scale integrated circuits (LSI) incorporating the device herein.

Thus it is seen that there has been added to the microwave switching art, an improved semiconductor switch which achieves low noise, low insertion loss operation by providing a narrow channel length geometry on a gallium arsenide substrate. The use of a gallium arsenide substrate enhances the noise characteristics of the device while the use of a resistive gate structure additionally assures a relatively large device power handling capability.

The unique structure of the invention allows the manufacture of the narrow channel length device without the critical alignment which has heretofore hampered the manufacture of gallium arsenide switching devices. Although the invention is especially attractive at microwave frequencies, the principles thereof are amenable to broadband operation. Therefore, the scope of the invention is in no way intended to be limited otherwise than as defined within the appended claims.

We claim:

1. A microwave switch which comprises:
   (a) a semiconductive substrate having oppositely disposed first and second surfaces;
   (b) first and second metallizations on said first surface of said substrate for applying a signal to said switch;
   (c) a high resistivity gate on said first surface of said substrate between said first and second metallizations, said resistive gate forming a Schottky barrier with said semiconductive substrate; and
   (d) means for controlling the depth of the Schottky depletion region so that said signal traverses an electrical path of variable conductivity.

2. A microwave switch as defined in claim 1 wherein said substrate is formed of semi-insulative material having a doped region therein, said doped region providing a switching channel between said first and second metallizations so that said channel may be rendered nonconductive by adjusting the depth of said Schottky depletion region to coincide with the depth of said doped region of said substrate.

3. A microwave switch as defined in claim 2 further characterized in that said substrate is fabricated of semi-insulative gallium arsenide having a doped region defining said switching channel.

4. A microwave switch as defined in claim 3 further characterized in that said high resistivity gate is formed of titanium dioxide.

5. A microwave switch as defined in claim 1 or claim 4 further characterized in that:
   (a) said first and second metallizations form Schottky barriers with said switching channel; and
   (b) said first and second metallizations are in intimate contact with said high resistivity gate.

6. In a Schottky barrier switch of the type wherein a microwave signal may be applied between a first metallization and a second metallization to a doped channel within an underlying substrate, the conductivity of said channel being a function of the portion of the Schottky depletion region thereof, and further including means for varying the portion of said channel comprising said Schottky depletion region, the improvement comprising a gate of highly resistive non-metallic material forming a Schottky barrier with said channel located between said first and second metallizations so that said first and second metallizations may be positioned in close proximity whereby the resulting length of said channel is correspondingly narrowed.

* * * * *